United States Patent
Yu et al.

(10) Patent No.: US 8,709,928 B2
(45) Date of Patent: Apr. 29, 2014

(54) SEMICONDUCTOR FIN DEVICE AND METHOD FOR FORMING THE SAME USING HIGH TILT ANGLE IMPLANT

(75) Inventors: Shao-Ming Yu, Zhubei (TW); Chang-Yun Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 713 days.

(21) Appl. No.: 12/689,588

(22) Filed: Jan. 19, 2010

(65) Prior Publication Data

US 2011/0175165 A1 Jul. 21, 2011

(51) Int. Cl.
*H01L 27/12* (2006.01)
*H01L 21/20* (2006.01)
*H01L 21/265* (2006.01)
*H01L 27/088* (2006.01)

(52) U.S. Cl.
USPC ............ 438/525; 438/478; 438/479; 438/514

(58) Field of Classification Search
USPC .......................... 438/302, 514, 517, 525, 531
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,297,581 B1* | 11/2007 | Hill et al. | 438/176 |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2006/0071264 A1* | 4/2006 | Hemink et al. | 257/315 |
| 2006/0175667 A1* | 8/2006 | Tsuchiaki | 257/391 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |
| 2009/0124069 A1* | 5/2009 | Clark et al. | 438/525 |
| 2009/0181477 A1 | 7/2009 | King et al. | |
| 2011/0175165 A1* | 7/2011 | Yu et al. | 257/347 |

* cited by examiner

*Primary Examiner* — Colleen Matthews
*Assistant Examiner* — William Harriston
(74) *Attorney, Agent, or Firm* — Duane Morris LLP

(57) ABSTRACT

An angled implantation process is used in implanting semiconductor fins of a semiconductor device and provides for covering some but not necessarily all of semiconductor fins of a first type with patterned photoresist, and implanting using an implant angle such that all semiconductor fins of a second type are implanted and none of the semiconductor fins of the first type, are implanted. A higher tilt or implant angle is achieved due to the reduced portions of patterned photoresist, that are used.

19 Claims, 5 Drawing Sheets

SEMICONDUCTOR FIN DEVICE AND METHOD FOR FORMING THE SAME USING HIGH TILT ANGLE IMPLANT

FIELD OF THE INVENTION

This disclosure relates, most generally, to semiconductor devices and methods for forming the same and more particularly to methods for carrying out angled implants with high implant angles on semiconductor fin devices and the structures formed according to such methods.

BACKGROUND

In the rapidly advancing world of semiconductor device manufacturing, semiconductor fin devices such as FinFET (fin Field Effect Transistor) and other devices are becoming favored because of the increased levels of integration and increased miniaturization that they enable. Fin devices typically involve a narrow, tall semiconductor fin formed over a substrate which may be a semiconductor substrate or an insulating substrate and provide the advantage that a transistor gate formed using the fin utilizes the sides and top of the fin for current flow thereby providing a gate width that may be magnitudes greater than the gate width of a transistor formed directly on the substrate, and improving device speed. The source and drain of such a transistor are also formed along the fin device.

Like conventional transistors formed in the substrate surface, the semiconductor material that forms the fin may be subjected to the introduction of dopant impurities therein, as the semiconductor surfaces of the fin serve as the channel, and the source and drain along which current flows, for FinFET transistor devices. The introduction of such dopant impurities typically occurs using ion implantation. An example of one such implantation process is an LDD, lightly doped drain, implant used to introduce dopant impurities in the form of ions, into the surfaces of the semiconductor fins by way of ion implantation. Angled ion implantation processes are available for such implanting operations, but the ability to thoroughly and uniformly implant the sides of the fins to provide a desired, uniform dopant profile, is limited by the high aspect ratios and tightly packed nature of the semiconductor fins, and further limited by the masking material, typically patterned photoresist, used to isolate the fins being implanted as well as the proximity to other types of fins which are not desired to be implanted. One type of fin (e.g. fins used for N-type devices) is typically implanted while fins of the other type (e.g. fins used for P-type devices) are covered with a masking material to prevent them from being implanted. Conventional methods do not provide a sufficiently high implant angle to completely, thoroughly and uniformly introduce dopant impurities into the sides of the semiconductor fins to provide a uniform dopant distribution. This limitation is illustrated in FIG. 1, which is indicative of conventional processing.

FIG. 1 shows substrate 101 which includes semiconductor fins 105, 107 formed over surface 103. Semiconductor fins 105 may represent fins of a first type used for a particular application and/or possessing a particular characteristic, e.g., for N-type transistors, whereas semiconductor fins 107 may represent fins of a second type used for different applications and/or having different characteristics, e.g., such as for P-type transistors. Semiconductor fins 105 are processed separately from semiconductor fins 107 and are spaced apart by separation distance 161.

FIG. 1 illustrates a conventional example in which photoresist pattern 109 is formed to cover semiconductor fins 107 while semiconductor fins 105 undergo an implantation processing operation. Photoresist pattern 109 includes edge 123 which is generally spaced about halfway between semiconductor fins 107 and semiconductor fins 105 in conventional technology. The implantation processing operation is designed to implant dopant species in the form of energized ions into sides 119 and top 121 of semiconductor fins 105 while semiconductor fins 107 are covered and not subjected to the ion implantation process. The angled implantation process is represented by parallel arrows 113 indicating the implant direction. It can be seen that implant angle 117 is limited by the presence and proximity of photoresist pattern 109 which covers semiconductor fins 107, thereby preventing the introduction of the dopant impurities into covered semiconductor fins 107. Photoresist pattern 109 covers and extends laterally past the semiconductor fins 107. It would be desirable to increase the implant angle 117 for any given thickness 111 of photoresist pattern and for any given separation distance 161 between semiconductor fins 105 and semiconductor fins 107, to more completely, thoroughly and uniformly introduce dopant impurities into the semiconductor fins.

The present invention addresses these limitations.

SUMMARY OF THE INVENTION

To address these and other needs and in view of its purposes, one aspect of the invention provides a method for implanting semiconductor fins in a semiconductor device using an angled implant with a high implant angle, the method comprising providing a plurality of first semiconductor fins and a plurality of second semiconductor fins over a surface of a substrate, covering some but not all of the first semiconductor fins and implanting using an angle of implantation such that all of the first semiconductor fins are blocked from implantation by the covering and such that all the second semiconductor fins are implanted.

According to another aspect, provided is a method for implantation using a high implant angle with respect to a side surface of a fin in a semiconductor device. The method comprises providing a wafer with a wafer surface, a plurality of first fins formed over the wafer surface and a plurality of second fins formed over the wafer surface. The method further provides for forming a photoresist pattern over the wafer, the photoresist pattern covering some but not all of the first fins wherein the first fins that are nearest the second fins are uncovered by the photoresist pattern and the second fins are not covered by the photoresist pattern. The second fins are implanted using an angled ion implant, and such that the first fins are not implanted.

According to another aspect, provided is another method for implantation using a high implant angle with respect to a side surface of a fin in a semiconductor device. The method comprises providing a wafer with a wafer surface, a plurality of first fins formed over the wafer surface and a plurality of second fins formed over the wafer surface including a facing second fin nearest the plurality of first fins. The method further provides for forming a photoresist pattern over the wafer, the photoresist pattern not covering the first fins and covering at least some of the second fins and wherein the photoresist pattern includes an edge that lies either a] over the facing second fin or b] between the facing second fin and the plurality of first fins and in closer proximity to the facing second fin than the plurality of first fins. The first fins are implanted using an angled ion implant, and such that the second fins are not implanted.

According to yet another aspect, provided is a semiconductor integrated circuit device formed according the aforementioned methods.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

One aspect of the invention is that, for a given feature morphology, in particular for a given arrangement of semiconductor fins such as for a given spacing between different types of semiconductor fins, a greater implantation angle can be achieved in angled ion implantation processes. That is, the direction of implant with respect to the side surface of the semiconductor fins, often referred to as the tilt or implant angle, is closer to perpendicular with respect to the side surface of the semiconductor fins formed over a substrate. By providing a higher tilt or implant angle, a desired doping profile and a desired doping distribution can be achieved and device performance can thereby be improved.

Figure 1:
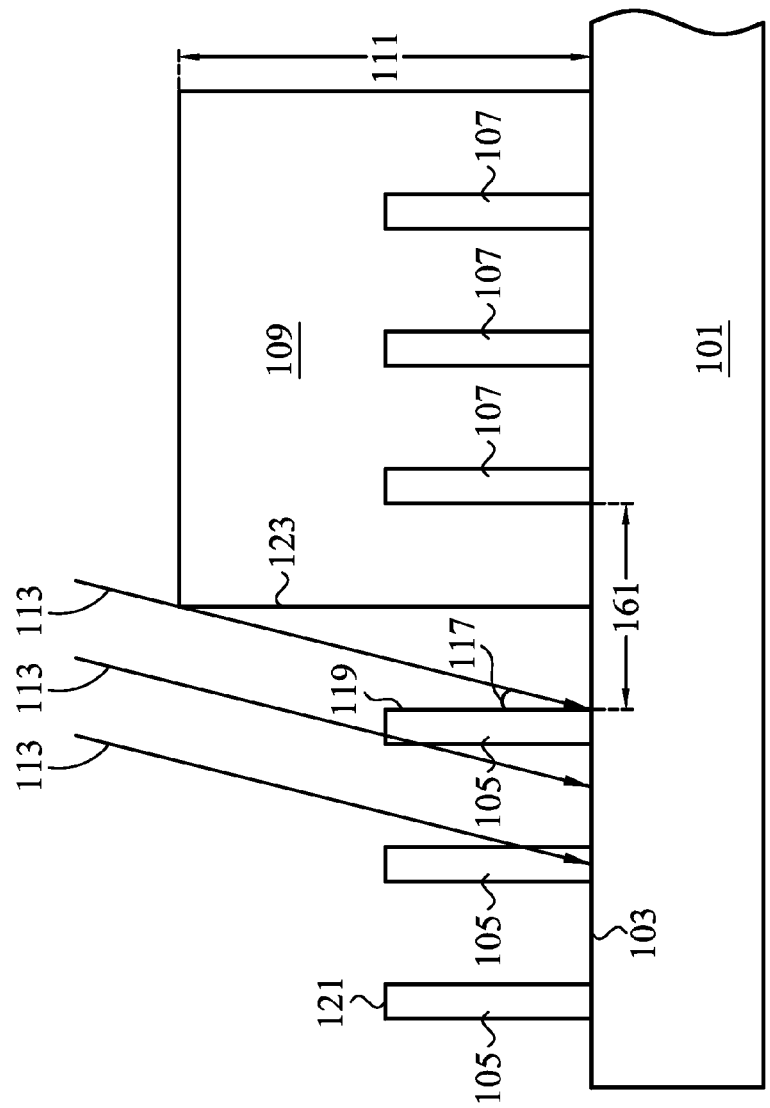
FIG. 1 is a cross-sectional view showing a typical tilt angle in a conventional angled ion implantation process according to the PRIOR ART.
Figure 2:
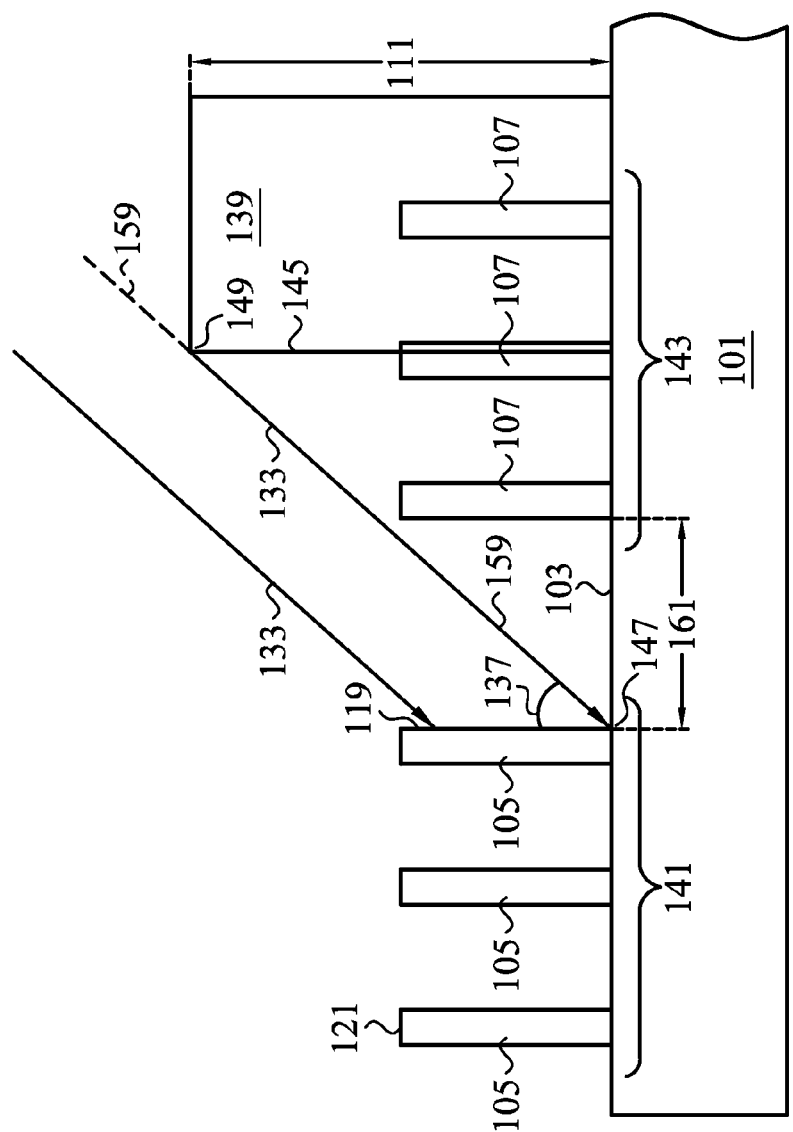
FIG. 2 is a cross-sectional view showing an exemplary angled ion implantation process with increased implantation angle according to the present invention.

Now referring to FIG. 2, substrate 101 includes semiconductor fins 105 and semiconductor fins 107 formed thereover. Substrate 101 may be a wafer used in the semiconductor manufacturing industry and according to one embodiment, substrate 101 may be a silicon wafer. According to other exemplary embodiments, substrate 101 may be a semiconductor wafer, such as crystalline silicon, silicon oxide, strained silicon, SOI (silicon on insulator), silicon germanium, doped or undoped polysilicon, doped or undoped silicon, silicon nitride, patterned or non-patterned wafers, and may include materials formed thereover, such as dielectric materials, conductive materials, silicon layers and metal layers. Surface 103 may represent the original surface of substrate 101 or it may represent an upper surface of a layer or of multiple layers, formed over substrate 101.

Semiconductor fins 105 and semiconductor fins 107 are formed over surface 103 using known methods and they may be formed of silicon, silicon germanium, germanium, or other suitable semiconductor materials advantageously used in the semiconductor manufacturing arts. FinFET or any of various other devices may be formed on semiconductor fins 105 and 107 and utilized in integrated circuit or other devices formed on substrate 101. Semiconductor fins 105 and 107 may include substantially the same cross-sectional dimensions or they may vary according to various exemplary embodiments. According to various exemplary embodiments, semiconductor fins 105 and 107 may include a width of 10-15 nm or greater and a height of greater than 30-50 nanometers but other heights and widths may be produced and used in other exemplary embodiments. Adjacent fins may be spaced apart by about 30 nm or greater and may have a pitch of about 40-70 nm or greater in various embodiments. According to one exemplary embodiment, each of semiconductor fins 105, 107 may have the same aspect ratio which may range from about 2:1 to about 6:1 (height:width) but other dimensions and aspect ratios may be used in other exemplary embodiments.

Semiconductor fins 105 are formed in substrate region 141 and semiconductor fins 107 are formed in substrate region 143. Substrate regions 141 and 143 may represent regions having different characteristics and/or in which different processing operations take place. According to one exemplary embodiment, substrate region 141 may represent an N+ region, i.e. a region in which N-type devices are formed and substrate region 143 may represent a P+ region, i.e. a region in which P-type semiconductor devices are formed. This is intended to be exemplary and not limiting of the different types of different substrate regions. At any rate, semiconductor fins 105 will be processed differently than semiconductor fins 107 at least in some processing operations. For example, the dopant impurities introduced into semiconductor fins 105 may differ from the dopant impurities introduced into semiconductor fins 107. Stated alternatively, semiconductor fins 105 and 107 represent two different types of fins.

FIG. 2 shows photoresist section 139 that covers some but not all of semiconductor fins 107. In the illustrated embodiment which includes three semiconductor fins 107 generally adjacent one another, photoresist section 139 covers semiconductor fin 107 disposed on the right hand side, partially covers centrally disposed semiconductor fin 107 and does not cover semiconductor fin 107 disposed on the left hand side. Alternatively stated, photoresist section 139 does not cover the semiconductor fin 107 that is nearest semiconductor fin 105 in the illustrated embodiment. Conventional methods may be used to deposit and pattern a photoresist film to produce photoresist section 139 with edge 145. In other exemplary embodiments, another suitable masking or covering material may be used instead of photoresist. Photoresist section 139 includes height 111 which may be 150 nm in one exemplary embodiment but may range from 100 nm to 500 nm in other exemplary embodiments.

Ion implantation processes used to implant energized ions as dopant impurities into materials, are known and may be generally anisotropic in nature with the direction of implantation accurately controlled. Arrows 133 indicate the direction of the angled implant. It should be noted that the generally right-to-left nature of the implantation direction is intended to be exemplary only and the techniques of the invention may be equally applied in any implantation direction. The two illustrated parallel arrows 133 are representative only and to show the tilt angle of the angled implant and it should be understood that the implantation process directs ions along the direction indicated by arrows 133, throughout the entire ion implantation tool environment. The illustrated angle of implant results in tilt or implant angle 137 that is maximized for a given thickness 111 and location of photoresist section 139 with respect to semiconductor fins 105 and semiconductor fins 107 spaced apart by separation distance 161. It will be shown, infra (see FIG. 5) that, for a given thickness 111 of photoresist material and a given separation distance 161 between semiconductor fins 105 and semiconductor fins 107, a greater implant or tilt angle is achieved with respect to surface 119, in comparison to conventional methods.

The implantation process may include any suitable process used to introduce dopant impurities into the respective semiconductor fins by way of ion implantation. Examples of such ion implantation processes include implantation processes used for forming source/drain regions, source/drain extension regions and implantation processes used to form channel regions. According to one exemplary embodiment, semiconductor transistors may be formed over semiconductor fins 105, 107 with the channel direction extending along the direction perpendicular to the plane of the figures but other fin devices may be formed in other exemplary embodiments. According to one exemplary embodiment, the angled implant may be an LDD, lightly doped drain, implant used to introduce dopant impurities into sides 119 and top 121 of semiconductor fins 105 but other implanting processes may be used in other exemplary embodiments. The angled implant may include the ion implantation of dopant impurities such as As, P, Sb, N, B and In in various exemplary embodiments but any of various other dopant impurities may be implanted according to other exemplary embodiments.

FIG. 2 shows that the angle is chosen such that the exposed, uncovered portions of semiconductor fins 107 are not implanted, i.e., the dopant impurities are not implanted into semiconductor fins 107. For a given implantation angle, the edge of photoresist portion 139, i.e. corner 149, determines the lateral extent to which the implant species will reach surface 103 as photoresist portion 139 blocks the energized ions. In the illustrated example, this is point 147, i.e. no dopant impurities will be implanted into the substrate to the right hand side of point 147. Moreover, no dopant impurities will be implanted into features that lie to the right hand side of dashed line 159, coexistent with lowermost arrow 133. Exposed semiconductor fins 107 are not implanted.

Figure 3:
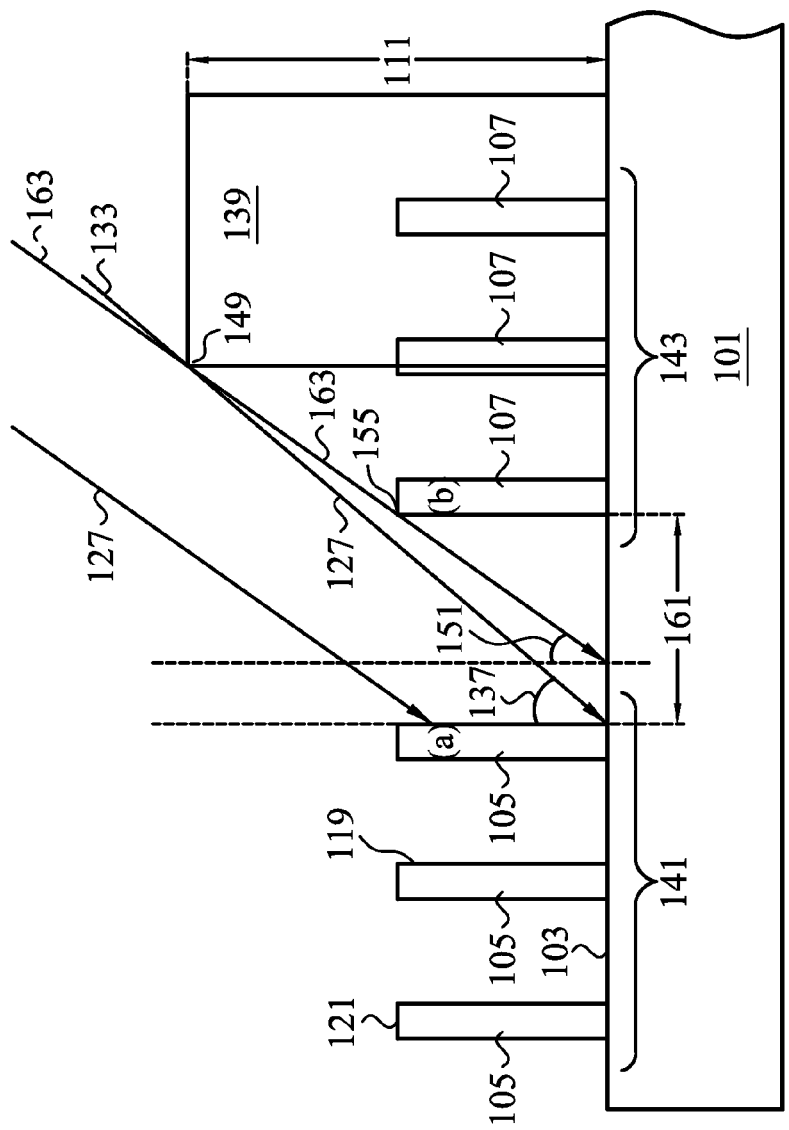
FIG. 3 is a cross-sectional view showing additional aspects of an exemplary angled ion implantation process according to the present invention.

FIG. 3 shows one exemplary range of implant angles that may be used advantageously in conjunction with exemplary illustrated structure including photoresist section 139 having height 111 and with separation distance 161 between semiconductor fins 105 and semiconductor fins 107. Separation distance 161 may be in the range of about 100-500 nm in various exemplary embodiments, but may vary in other exemplary embodiments. Implant angle 137, produced when the implantation direction is along the direction indicated by arrow 133, represents the greatest implant angle with respect to surface 119. In the exemplary arrangement of features, it can also be seen that an implant angle as low as angle 151 may be utilized without undesirably implanting the energized ion dopant species into any exposed semiconductor fin 107. According to the exemplary embodiment in which the implantation direction is along the direction indicated by parallel arrows 127, it can be seen that no structure to the right hand side of line 163, coexistent with right-hand most arrow 127, is subjected to the implantation process, i.e. semiconductor fin 107 including corner 155 is not subjected to the implantation process.

An aspect of the invention, then, is that for any of various arrangements of device features, less than all of semiconductor fins of one type are required to be covered by photoresist or other masking or covering material, when selectively introducing dopant impurities into the other semiconductor fins, i.e. semiconductor fins of another type. Moreover, a greater implant angle is achievable with respect to the side fin surfaces of the fins being implanted and without covering all of the other fins that are not being implanted. An aspect of the invention, then, is a method for implanting semiconductor fins in a semiconductor device using an angled implant with a high implant angle. The method comprises providing a plurality of first semiconductor fins and a plurality of second semiconductor fins over a substrate surface, covering some but not all of the first semiconductor fins, and implanting using an angle of implantation such that all of the first semiconductor fins are blocked from implantation by the covering and such that all second semiconductor fins are implanted. For a given photoresist film with a given height, and for a given spacing between the different types of fins, the photoresist section may be formed at various locations and not covering all fins that are desired to be protected from being implanted, and a plurality of implant angles may be used to selectively introduce dopant impurities into the fins desired to be implanted without implanting dopant impurities into the uncovered fins that are not desired to be implanted.

Figure 4:
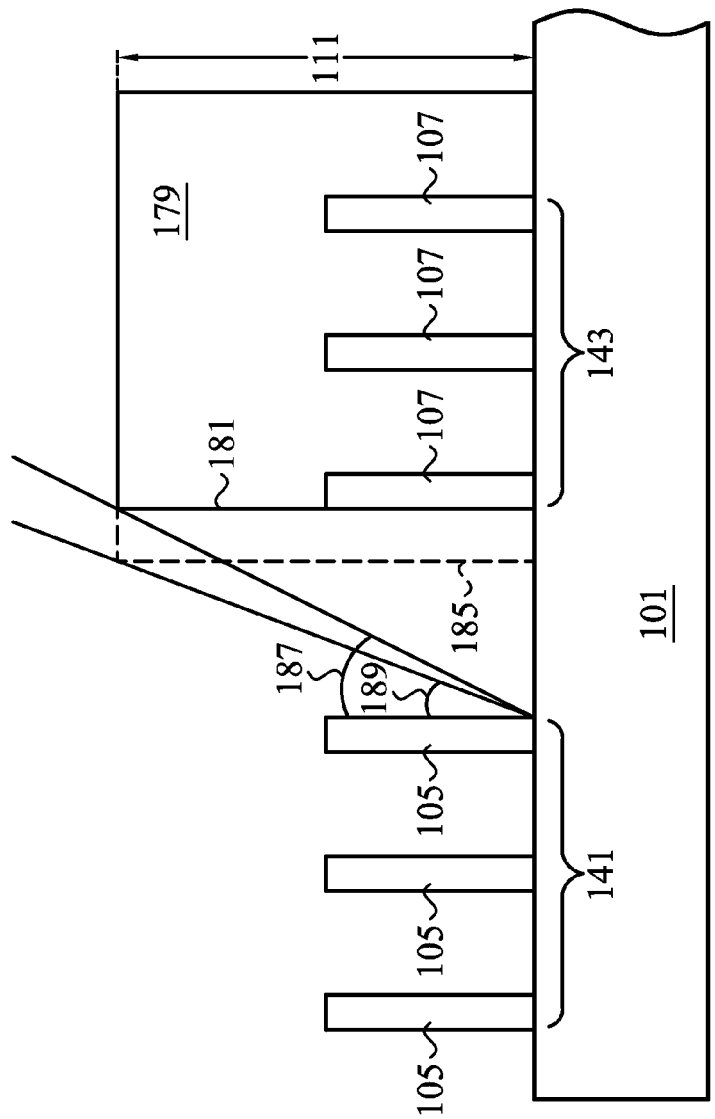
FIG. 4 is a cross-sectional view showing another exemplary angled ion implantation process with increased implantation angle according to the present invention.

Another aspect of the invention shown in FIG. 4 provides for covering all of the semiconductor fins of one type with photoresist or other masking or covering material, when selectively introducing dopant impurities into the other semiconductor fins, e.g. semiconductor fins of another type. A greater implant angle is also achievable in this exemplary embodiment, in comparison to conventional techniques in which the edge the masking or covering material is generally spaced about halfway between the different groups of semiconductor fins 107.

FIG. 4 shows photoresist section 179 that covers all of semiconductor fins 107 and includes height 111. Separation distance 161 is present between semiconductor fins 105 and semiconductor fins 107. Photoresist section 179 includes edge 181 even with the semiconductor fin 107 closest to semiconductor fins 105. In another exemplary embodiment, photoresist section 179 may include edge 185 (shown in dashed line) that resides between semiconductor fins 107 and 105 but is closer to semiconductor fins 107. According to either of these exemplary embodiments that include implant angles 187 and 189, respectively, the advantage of a higher implant angle than achievable in the prior art, is still achieved.

Figure 5:
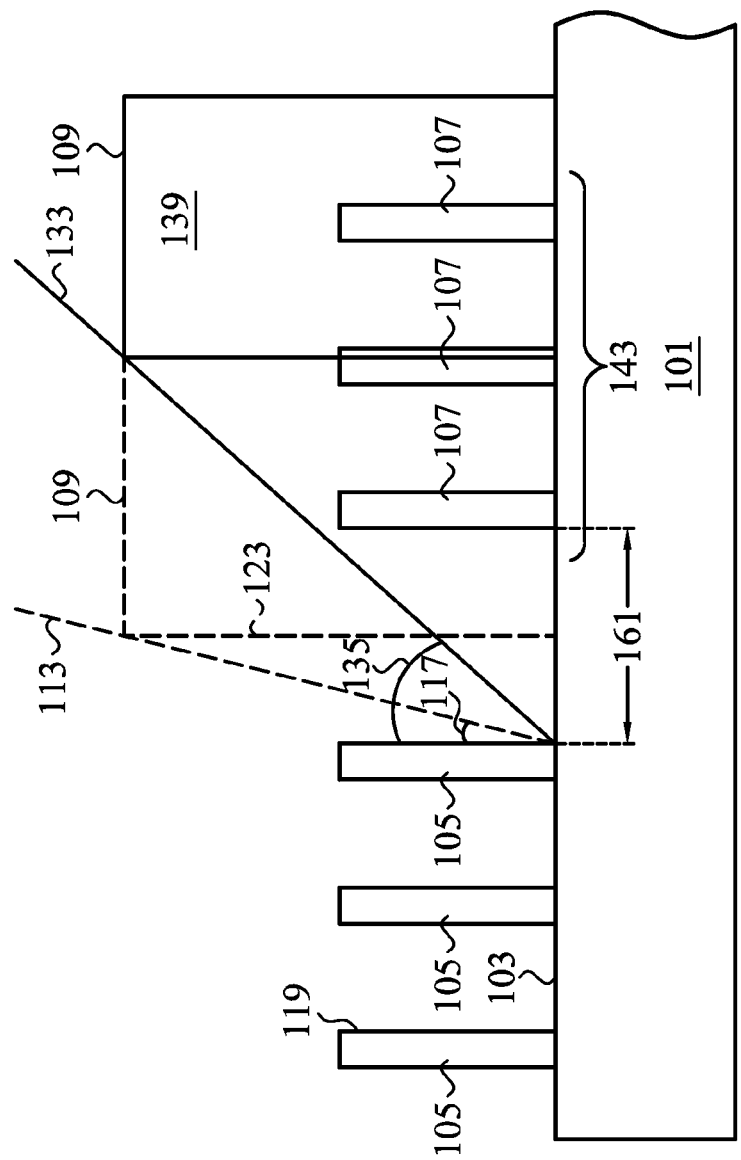
FIG. 5 is a cross-sectional view showing a comparison between a conventional angled ion implantation process and an exemplary ion implantation process according to the invention.

FIG. 5 shows an exemplary comparison between the prior art arrangement and one aspect of the present invention for the exemplary illustrated arrangement of features. According to conventional methods in which semiconductor fins 107 are not desired to be implanted, all such semiconductor fins 107 are covered by photoresist pattern 109, indicated in part by dashed lines and which includes an edge 123 which is spaced about halfway between semiconductor fins 107 and semiconductor fins 105. According to this conventional arrangement, the highest achievable implant angle 117 is produced using an implantation process carried out along the direction indicated by the dashed line arrow 113. According to one exemplary embodiment of the present invention, in which only photoresist section 139 is employed, leaving one semiconductor fin 107 and portion of a second semiconductor fin 107 uncovered, a greater implant angle 135 can be achieved by using an ion implantation process in which the implant direction is along the direction indicated by arrow 133 which still avoids the introduction of dopant impurities into any of semiconductor fins 107. In one such exemplary embodiment in which separation distance 161 is about 140 nm and thickness 111 is about 150 nm, an increase in implant angle from about 12° (angle 117) to about 45° (angle 135) may be achieved but this is exemplary only and the increase in implant angle will vary depending on separation distance 161, thicknesses 111 and other dimensions used. According to another exemplary embodiment (not illustrated in FIG. 5 but see FIG. 4), the photoresist section may cover all of the semiconductor fins 107 but include an edge even with the semiconductor fin 107 closest to semiconductor fins 105, or the photoresist section may have an edge between semiconductor fins 107 and 105 but closer to semiconductor fins 107 and still achieve the advantage of a higher implant angle than achievable in the prior art which uses an ion implantation process in which the implant direction is along the direction indicated by arrow 113.

After the conclusion of the described angled implantation process, the photoresist or other covering is removed and device fabrication continues according to known methods to form integrated circuit devices. Another aspect of the invention is the semiconductor or other integrated devices so formed.

The preceding merely illustrates the principles of the disclosure. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although this disclosure is presented in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for implanting semiconductor fins in a semiconductor device using an angled implant with a high implant angle, said method comprising:
   providing a plurality of first semiconductor fins and a plurality of second semiconductor fins over a surface of a substrate;
   covering tops of some but not all of said first semiconductor fins with a masking material; and
   implanting using an angle of implantation such that all of said first semiconductor fins are blocked from implantation by said masking material and such that all said second semiconductor fins are implanted.

2. The method as in claim 1, wherein said covering tops of some but not all of said first semiconductor fins comprises using photoresist and said masking material comprises a patterned photoresist film.

3. The method as in claim 1, wherein said plurality of first semiconductor fins are grouped together and said plurality of second semiconductor fins are grouped together and said covering tops of some but not all of said first semiconductor fins with a masking material comprises not covering said first semiconductor fins that are nearest said second semiconductor fins.

4. The method as in claim 1, wherein said first semiconductor fins are formed over a substrate portion having a first polarity and said second semiconductor fins are formed over a further substrate portion having an opposite polarity.

5. The method as in claim 1, wherein said providing comprises forming a layer of semiconductor material over said surface and patterning said layer of semiconductor material to form said first and second semiconductor fins.

6. The method as in claim 1, wherein said implanting comprises an LDD (lightly doped drain) implantation process.

7. The method as in claim 1, wherein said implanting comprises implanting ions of at least one of As, P, Sb, N, B and In and said angle of implantation is about 45° with respect to side surfaces of said second semiconductor fins.

8. A semiconductor integrated circuit device formed according to the method of claim 1.

9. The semiconductor integrated circuit device as in claim 8 wherein said semiconductor integrated circuit device comprises a FinFET device, said substrate comprises a silicon on insulator substrate and said first and second fins are each formed of a semiconductor material.

10. A method for implantation using a high implant angle with respect to a side surface of a fin in a semiconductor device, said method comprising:
   providing a wafer with a wafer surface, a plurality of first fins formed over said wafer surface and a plurality of second fins formed over said wafer surface;
   forming a photoresist pattern over said wafer, said photoresist pattern covering some but not all of said first fins wherein said first fins that are nearest said second fins are uncovered by said photoresist pattern and said second fins are not covered by said photoresist pattern; and
   implanting said second fins using an angled ion implant and controlling an angle of said angled implant such that none of said uncovered first fins are implanted during said implanting.

11. The method as in claim 10, wherein said first fins include therein a dopant impurity of a first polarity and said second fins include therein a dopant impurity of the opposite polarity.

12. The method as in claim 10, wherein said first fins are formed over a first substrate portion of a first polarity and said second fins are formed over a second substrate portion of the opposite polarity.

13. The method as in claim 10, wherein said first fins are formed in an array and said photoresist pattern covers said array except for an outermost first fin of said array that is adjacent said second fins.

14. The method as in claim 10, wherein said providing comprises forming said first fins and said second fins to substantially the same height.

15. The method as in claim 10, wherein said implanting comprises carrying out a lightly doped drain (LDD) implantation process.

16. The method as in claim 10, wherein said semiconductor device comprises a FinFET device, said semiconductor wafer comprises a silicon on insulator substrate and said first and second fins are each formed of a semiconductor material.

17. The method as in claim 10, wherein each of said first fins and said second fins comprises silicon, and further comprising forming transistor devices on at least some of said first fins and on at least some of said second fins.

18. A method for implantation using a high implant angle with respect to a side surface of a fin in a semiconductor device, said method comprising:

providing a wafer with a wafer surface, a plurality of uncovered fins formed over said wafer surface, a plurality of covered fins formed over said wafer surface and covered with photoresist and a partially covered fin;

wherein said photoresist is formed in a pattern that includes an edge that lies over said partially covered fin; and implanting said uncovered fins using an angled ion implant and using an implant angle such that said partially covered fin and said uncovered fin adjacent said partially covered fin, are not implanted.

19. The method as in claim 18, wherein said covered fins, said partially covered fin and an adjacent uncovered fin adjacent said partially covered fin, are formed over a first substrate portion of a first polarity, said uncovered fins except for said adjacent uncovered fin are formed over a second substrate portion of the opposite polarity and arranged in an array, and said implanting comprises implanting ions of at least one of As, P, Sb, N, B and In, and further comprising forming transistor devices on at least some of said uncovered fins and on at least some of said covered fins.

\* \* \* \* \*